United States Patent [19]
Larson

[11] Patent Number: 6,085,573
[45] Date of Patent: Jul. 11, 2000

[54] GLASS PARTS PICK-UP JIG

[75] Inventor: Travis L. Larson, Boise, Id.

[73] Assignee: MCMS, Inc., Nampa, Id.

[21] Appl. No.: 09/010,206

[22] Filed: Jan. 20, 1998

[51] Int. Cl.[7] .................................................. G01B 11/00
[52] U.S. Cl. ........................... 73/1.79; 33/502; 356/243.1
[58] Field of Search .................................. 73/1.79, 865.9; 33/502; 356/243.1

[56] References Cited

U.S. PATENT DOCUMENTS

| | | | |
|---|---|---|---|
| 3,999,866 | 12/1976 | Mathison | 356/243.1 X |
| 4,738,025 | 4/1988 | Arnold | 29/834 |
| 4,776,088 | 10/1988 | Biggs et al. | 29/834 |
| 4,908,777 | 3/1990 | Wolfe | 395/89 |
| 5,029,383 | 7/1991 | Snyder et al. | 29/740 |
| 5,237,622 | 8/1993 | Howell | 356/243.1 X |
| 5,247,844 | 9/1993 | Howell | 356/243.1 X |
| 5,421,697 | 6/1995 | Ostwald | 414/753 |
| 5,537,204 | 7/1996 | Woodhouse | 356/243 |
| 5,539,992 | 7/1996 | Woodhouse | 33/533 |

FOREIGN PATENT DOCUMENTS

| | | | |
|---|---|---|---|
| 216169 | 8/1994 | Japan . | |
| 2011153 | 4/1994 | Russian Federation | 73/1.79 |

*Primary Examiner*—Thomas P. Noland
*Attorney, Agent, or Firm*—Joseph W. Holland

[57] ABSTRACT

A method apparatus for assisting in the calibration of a pick and place machine including a parts pick up jig having a first feeder shoe for placement over the end of one of the feeder stations and second feeder shoe for placement over the end of an adjacent feeder station allowing for the safe and accurate pick-up of glass chips by the part placement nozzle. The feeder shoes are placed over the ends of the feeder stations with the end of feeder stations extending inside the feeder shoes against feeder shoe nose panels to assure accurate placement of the parts pick up jig on the "Y" axis. The parts pick up jig may also index against an inner or outer edge of the feeder station to assure accurate placement of parts pick up jig on the "X" axis. A bridge section extends between the feeder shoes and connects the two feeder shoes together. Formed on the upper surface of the bridge section are a series of recesses for receiving and aligning chips to be picked and placed during a calibration procedure.

7 Claims, 4 Drawing Sheets

GLASS PARTS PICK-UP JIG

BACKGROUND

1. Technical Field

This invention relates generally to printed circuit board assembly, and more specifically, to a method and apparatus for facilitating the calibration of pick and place equipment.

2. Background of the Invention

Integrated and discrete components are commonly assembled onto printed circuit boards (PCBs) using pick and place equipment to set the various component parts on the board prior to attachment. Fuji America Corporation of Lincolnshire, Ill., as well as other manufacturers provide a variety of pick and place equipment.

The pick and place device typically includes a conveyor section which receives and transports a PCB onto an assembly table. The table is capable of movement in commonly two and occasionally in three axes. The PCB is positioned generally below at least one placing head.

Each placing head includes a part placement nozzle, which picks a component part typically employing a vacuum applied to the upper face of the component part. The component part is picked from a first position, for example from a tape-and-reel which dispenses a particular component part at a preselected position. After the part placement nozzle has picked the component part, the placing head moves laterally as required to position the component part over the PCB. The assembly table is also advanced along its X and Y axes as required to position the PCB for placement of the component part. As positioning occurs, the component part is also aligned with the PCB, by rotation of the placing head to orient the component part as required relative to the PCB.

The device next places the component part against the upper surface of the PCB in its preselected location, the part placement nozzle typically exerting pressure against the upper face of the component part, securing the component part against the face of the PCB. In a subsequent process step, the component part is permanently affixed to the surface of the PCB, often by heating a solder which has been previously applied to the surface of the PCB.

To ensure the proper alignment of the component part on the PCB, the pick and place equipment must be calibrated occasionally. Calibration may be achieved with actual electronic component parts and printed circuit boards. Using this method, the component parts are assembled onto the PCB by the pick and place equipment. The alignment of the device is checked using visual inspection with an unaided eye or using a microscope. If the component parts are determined to be misaligned in the X-, Y-, or θ (rotational) axes, adjustments to the pick and place equipment are required. The process of adjustment and visual inspection continues until an acceptable alignment of the component part with the PCB is achieved. A similar calibration system is described in U.S. Pat. No. 4,776,088.

Alternately, calibration may be achieved by the method and employing the apparatus disclosed in U.S. Pat. No. 5,537,204. The method and apparatus disclosed in U.S. Pat. No. 5,537,204 include loading a glass fiducial plate onto an assembly table of a pick and place machine, loading a glass chip onto a part placement nozzle of the pick and place machine, and placing the glass chip onto the plate. Alignment of a fiducial point on the fiducial plate with a target window on the chip is examined. Responsive to the alignment of the target and the fiducial, key calibration codes in calibration software of the pick and place machine may be adjusted. Once calibration is complete, multiple placement cycles using the glass fiducial plate and glass chips are performed to determine the statistical placement capability of the pick-and-plate equipment.

A problem associated with the method and apparatus described above involves the loading of the glass chip onto the part placement nozzle of the pick and place machine. In order for the glass chip to be placed onto the part placement nozzle the machines safety doors must be overridden by employing typically a key or set of keys which are inserted into a slot or slots, thereby disabling the safety doors. Once disabled, an operator manually places the glass chip on the end of the part placement nozzle by pressing a key temporarily stop movement of the machine then reaching into the device exposing the operator's arms and hands to the possibility of injury within the device. Additionally, because the glass chip is placed manually on the end of the nozzle, it is difficult for the operator to assure proper alignment of the glass chip. While the pick and place machine has the capability of determining the extent to which a component part has been picked askew of a desired rotational orientation, the rapid movement of the nozzle against the surface of the glass chip may create a situation wherein the part continues to rotate even though the nozzle has ceased rotation due to the relatively low coefficient of friction of the surface of the glass chip.

What is needed is a method and apparatus which allows for the safe and accurate pick-up of glass chips by the part placement nozzle of the pick and place equipment during calibration.

SUMMARY OF THE INVENTION

According to the present invention, a parts pick up jig for use in the calibration of a pick and place machine may include a planar element having a first end, a second end, an upper surface, an "X" axis aligning member attached to the planar element for aligning the parts pick up jig with the pick and place machine "X" axis, a "Y" axis aligning member attached to the planar element for aligning the parts pick up jig with the pick and place machine "Y" axis, and a chip receiving and aligning member formed on the upper surface of the planar element for holding the chip for picking and aligning the chip with the pick and place machine "X" axis and the pick and place machine "Y" axis.

Accordingly, one embodiment of the invention includes a first feeder shoe for placement over the end of one of the feeder stations and a second feeder shoe for placement over the end of an adjacent feeder station allowing for the safe and accurate pick-up of glass chips by the part placement nozzle. The feeder shoes are placed over the ends of the the feeder stations with the ends of feeder stations extending inside the feeder shoes against the feeder shoe nose panel to assure accurate placement of the parts pick up jig on the "Y" axis. The parts pick up jig includes an "X" axis aligning member formed as an inner or outer face of the first feeder shoe and/or the second feeder shoe which indexes against an inner or outer face of a feeder station to assure accurate placement of parts pick up jig on the "X" axis. The parts pick up jig also includes a "Y" axis aligning member formed as a feeder shoe nose panel which indexes against the nose of the feeder shoe to assure accurate placement of the parts pick up jig on the "Y" axis.

The planar element includes a bridge section which extends between the feeder shoes and connects the two feeder shoes together. A chip receiving and aligning member is formed on the upper surface of the bridge section for holding the chip for picking and aligning the chip with the pick and place machine "X" axis and the pick and place machine "Y" axis.

A system for calibrating a pick and place machine, according to one embodiment of the invention, may include, in addition to the parts pick up jig described above, a calibration plate having a surface bearing a first calibration mark and a calibration chip which is removably placeable on the calibration plate, the surface of the calibration chip bearing a second calibration mark.

Other advantages will become apparent to those skilled in the art from the following detailed description read in conjunction with the appended drawings and claims attached hereto.

DETAILED DESCRIPTION OF THE INVENTION

Figure 1:
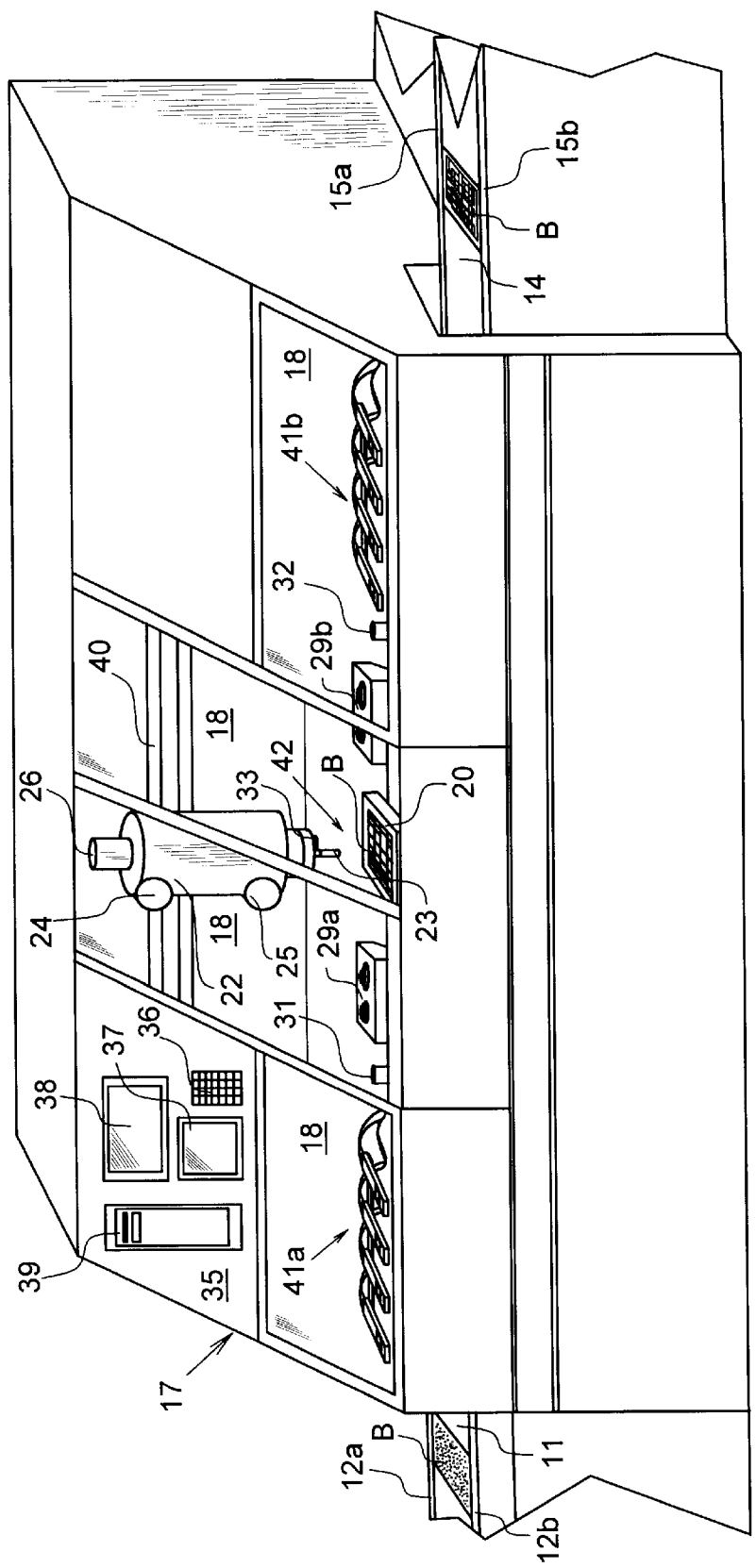
FIG. 1 is a perspective representational view of a pick and place machine.

Referring now to FIGS. 1 through 7, the present invention will be more fully described. FIG. 1 is a perspective representational view of a semiconductor pick and place machine illustrated generally at 10. Pick and place machine 10 is typically located in sequence with a number of semiconductor device fabrication machines which perform a variety of manufacturing processes. Pick and place machine 10 may typically include in conveyor section 11 including first in conveyor rail 12a and second in conveyor rail 12b, for on loading PCA's into pick and place machine 10. Pick and place machine 10 also typically includes out conveyor 14 having first out conveyor rail 15a and second out conveyor rail 15b.

Figure 2:
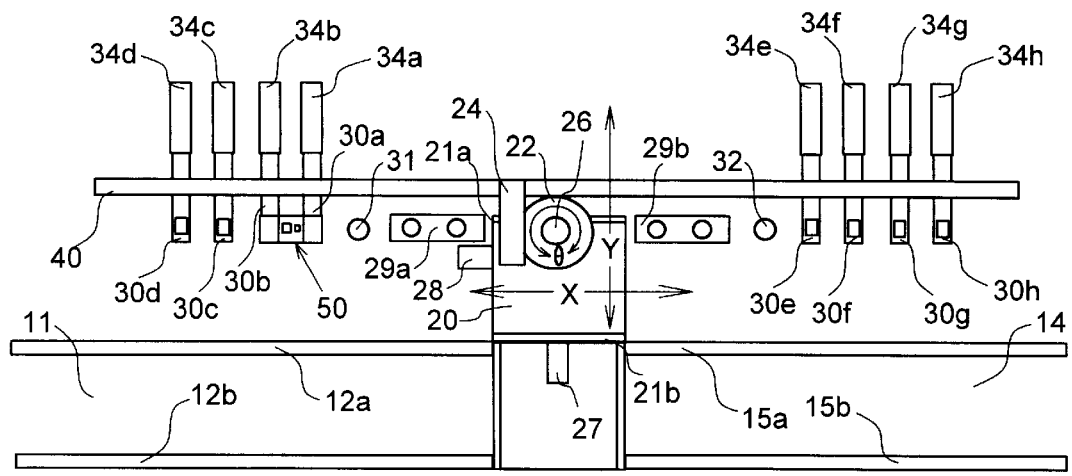
FIG. 2 is a top representational view of various components contained within a pick and place machine.

FIG. 1 also illustrates pick and place machine 10 including machine housing 17 having windows 18 which enclose the operative components of pick and place machine 10. Referring to FIGS. 1 and 2, pick and place machine 10 also includes assembly table 20 having first assembly table rail 21a and second assembly table rail 21b. Assembly table 20 moves forward and backward along its "Y" axis from a first position where a printed circuit board B is loaded between first assembly table rail 21a and second assembly table rail 21b to a second position where assembly table 20 is positioned generally below placing head 22. Assembly table 20 is movable laterally along its "Y" axis permitting location of printed circuit board B below placing head 22. Assembly table 20 is driven in the "Y" direction by Y table drive 27.

Figure 3:
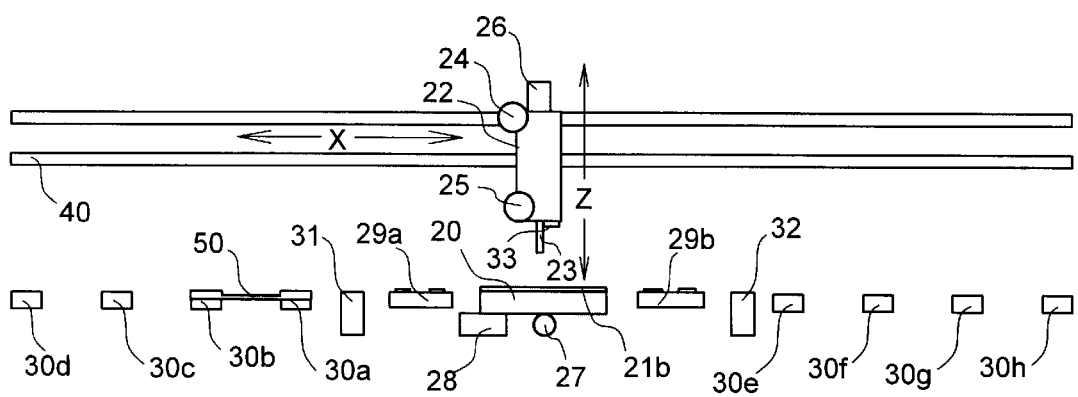
FIG. 3 is a front representational view of various components contained within a pick and place machine.

Referring to FIGS. 1, 2 and 3, placing head 22 includes part placement nozzle 23. Placing head 22 is movable laterally along rails 40 in the "X" direction to permit positioning of part placing head 22 over a variety of stations depending upon the given function being performed. The variety of stations may include first nozzle station 29a and second nozzle station 29b. Part placement nozzle 23 is interchangeable with a variety of nozzles located at first nozzle station 29a and second nozzle station 29b dependent upon the part to be picked and placed. Placing head 22 is driven in the "X" direction by X head servo motor 24. Placing head 22 is movable vertically along the "Z" axis to permit picking and placing functions of placing head 22. Placing head 22 is movable in the "Z" axis by Z head servo motor 25. Finally, part placement nozzle 23 is rotatable about the θ axis by θ head servo motor 26.

Placing head 22 is movable laterally to permit positioning over any of the feeder stations, feeder station 30a, feeder station 30b, feeder station 30c, feeder station 30d, feeder station 30e, feeder station 30f, feeder station 30g and feeder station 30h. Tape-and-reel feeders 34a, 34b, 34c, 34d, 34e, 34f, 34g, and 34h provide a source for component parts delivered at the feeder stations.

In operation, and depending upon the program being executed by pick and place machine 10, placing head 22 may move laterally to first nozzle station 29a or second nozzle station 29b, interchange part placement nozzle 23, move again laterally to one of the feeder stations, designated generally as first pick station 41a and second pick station 41b, picking a component part from one of the feeder stations, move laterally again along rails 40 to placement position designated generally at 42 across first sensor camera 31 or second sensor camera 32, depending upon the direction of travel of placing head 22. First sensor camera 31 or second sensor camera 32 scan the component part from below to confirm that it is the correct component.

Fiduciary camera 33 is shown mounted to placing head 22 to monitor the exact position of printed circuit board B on assembly table 20. This data is provided to CPU 39 within pick and place machine 10 and processed to aid control of the placement of the component part on printed circuit board B.

Operation panel 35 may include a keypad 36 for controlling the various functions of pick and place machine 10, camera screen 37 for monitoring placing head 22 travel and component part placement, and monitor 38 for viewing pick and place machine 10 status and control information.

Figure 6:
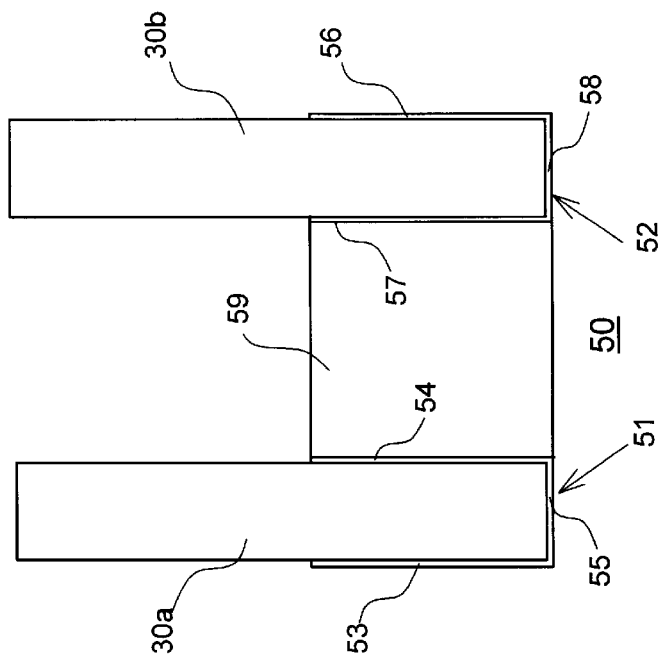
FIG. 6 is a bottom view of a glass part pick up jig.
Figure 4:
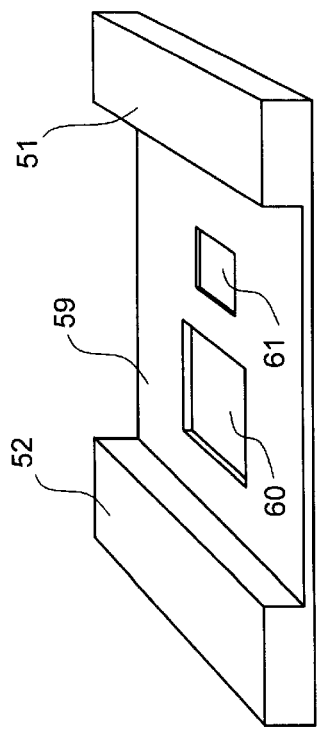
FIG. 4 is a representational view of a glass part pick up jig.
Figure 5:
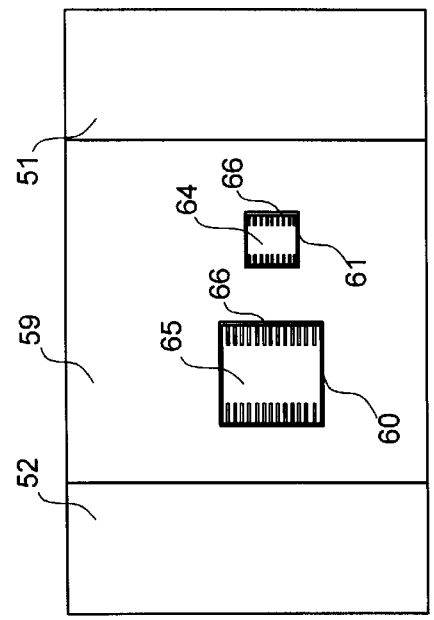
FIG. 5 is a top view of a glass part pick up jig.

Referring to FIGS. 4, 5 and 6, parts pick up jig 50 may include a first feeder shoe 51 for placement over the end of one of the feeder stations and second feeder shoe 52 for placement over the end of an adjacent feeder station. First feeder shoe 51 may include first feeder shoe outer panel 53, first feeder shoe inner panel 54 and first feeder shoe nose panel 55. Similarly, second feeder shoe 52 may include second feeder shoe outer panel 56, second feeder shoe inner panel 57 and second feeder shoe nose panel 58.

Extending between first feeder shoe 51 and second feeder shoe 52 and attached at either of its two ends to first feeder shoe 51 and second feeder shoe 52 is bridge section 59. Formed on the upper surface of bridge section 59 are small chip recess 61 for receiving small glass chip 64 and large chip recess 60 for receiving large glass chip 65. The front and back margins of small chip recess 61 and large chip recess 60 are substantially parallel to the "X" axis of pick and place machine 10. Similarly, the right and left side margins of small chip recess 61 and large chip recess 60 are substantially parallel to the "Y" axis of pick and place machine 10. This configuration assures that small glass chip 64 and large glass chip 65 are aligned with the pick and place machine "X" axis and the pick and place machine "Y" axis.

Figure 7:
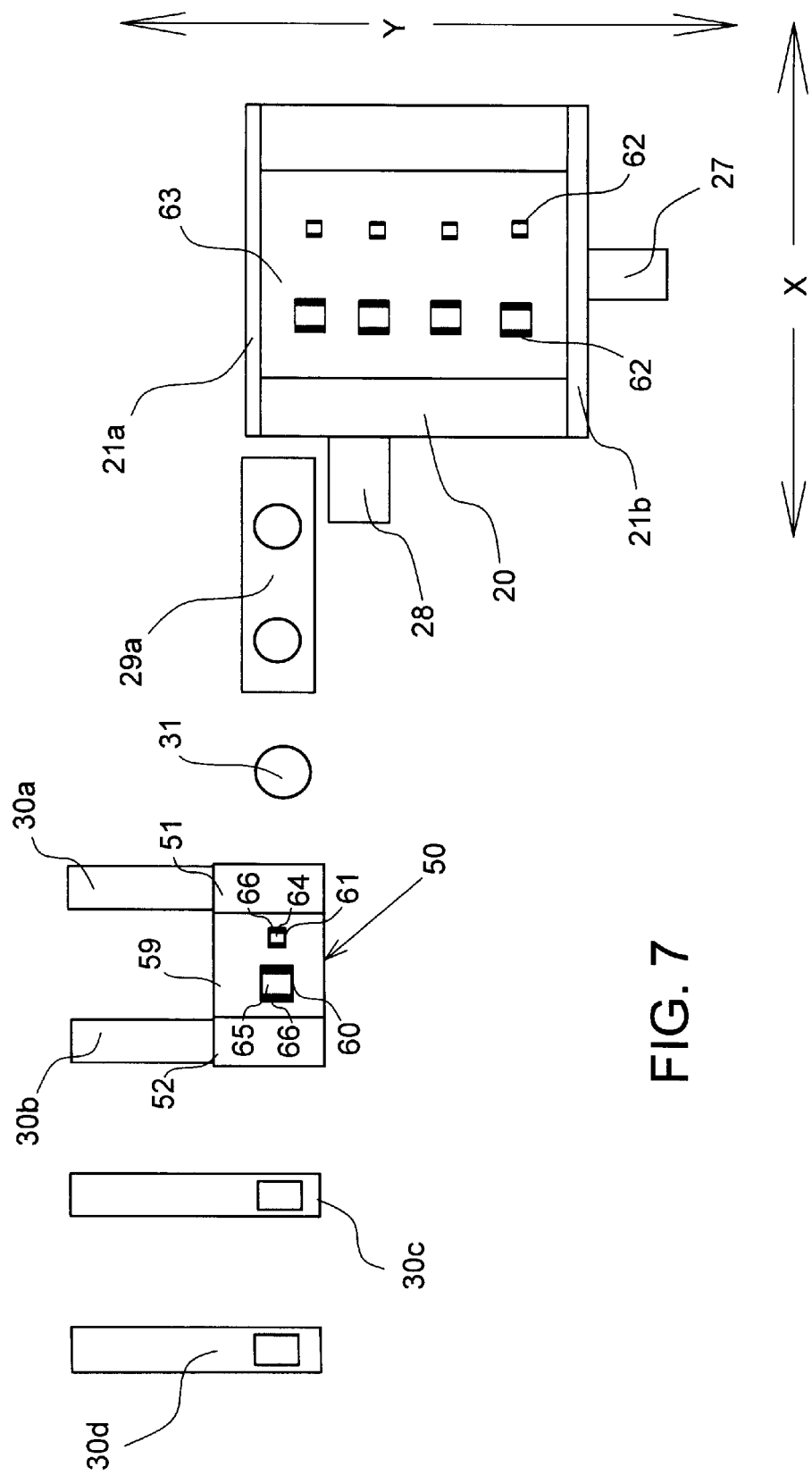
FIG. 7 is a top representational view of various components contained within a pick and place machine including a glass part pick up jig and a calibration plate.

Referring to FIGS. 1 and 7, placement accuracy is calibrated and adjusted by running a calibration program. A calibrated glass plate 63, having second calibration marks 62 and typically an adhesive surface, replaces printed circuit board B and is placed on in conveyor section 11 and transported to assembly table 20. Small glass chip 64 and large glass chip 65, each having first calibration marks 66 for placement on calibrated glass plate 63. Calibrated glass plate 63 and small glass chip 64 and large glass chip 65 are generally about the same size as the elements they replace. Second calibration marks 62 on calibrated glass plate 63 and first calibration marks 66 on small glass chip 64 and large glass chip 65 may be in the form of dots, outline of electronic component packages, windows, cross hairs, bull's-eyes or the like.

Referring to FIGS. 1 and 7 in use, a calibrated glass plate 63 is positioned in assembly table 20. Calibrated glass plate 63 typically has the same dimensions as the PCB's being processed and similarly placed fiduciary dots. Parts pick up jig 50 is placed over a pair of adjacent feeder shoes as shown in FIG. 3 with first feeder shoe 51 being placed over feeder station 30a and second feeder shoe 52 being placed over feeder station 30b.

As shown in FIG. 6, the end of feeder station 30a extends inside first feeder shoe 51 against first feeder shoe nose panel 55 and the end of feeder station 30b extends inside second feeder shoe 52 against second feeder shoe nose panel 58 assuring accurate placement of parts pick up jig 50 on the "Y" axis. The outside edge of feeder station 30a extends inside first feeder shoe 51, against first feeder shoe outer panel 53, and the inside edge of feeder station 30a extends inside first feeder shoe 51 against first feeder shoe inner panel 54. Similarly, the outside edge of feeder station 30b extends inside second feeder shoe 52 against second feeder shoe outer panel 56 and the inside edge of feeder station 30b extends inside second feeder shoe 52 against second feeder shoe inner panel 57. This configuration assures accurate placement of parts pick up jig 50 on the "X" axis.

As shown in FIGS. 5 and 7, small glass chip 64 is inserted in small chip recess 61 and large glass chip 65 is inserted in large chip recess 60. Placing head 22 moves to a pick position over parts pick up jig 50 and picks either small glass chip 64 or large glass chip 65. Next, placing head 22 moves to the place position over calibrated glass plate 63 which is positioned on assembly table 20, placing the calibrated chip over a preselected position on calibrated glass plate 63. This operation is repeated with the remaining chip.

Following placement of small glass chip 64 and large glass chip 65 on calibrated glass plate 63, calibrated glass plate 63 is transported out of pick and place machine 10 on out conveyor 14 and the relative alignment of small glass chip 64 and large glass chip 65 to calibrated glass plate 63 is checked by observing the relative alignment of first calibration marks 66 located on small glass chip 64 and large glass chip 65 to second calibration marks 62 located on calibrated glass plate 63.

This may be accomplished visually by optical comparison.

A method of monitoring the accuracy of part placement of a pick and place machine generally comprises the acts of:

picking a calibrated chip having a first calibration mark from a parts pick up jig with the pick and place machine placing head;

placing the calibrated chip on a calibrated plate top surface having a second calibration mark with the pick and place machine placing head, the calibrated plate being located on a pick and place machine assembly table; and comparing the relative alignment of the first calibration mark and the second calibration mark.

While this invention has been described with reference to the described embodiments, this is not meant to be construed in a limiting sense. Various modifications to the described embodiments, as well as additional embodiments of the invention, will be apparent to persons skilled in the art upon reference to this description. It is therefore contemplated that the appended claims will cover any such modifications or embodiments as fall within the true scope of the invention.

I claim:

1. A parts pick up jig for use in the calibration of the accuracy of placement of components by a pick and place machine comprising:

a planar element having a first end, a second end and an upper surface;

an "X" axis aligning member attached to the planar element for aligning the parts pick up jig with the pick and place machine "X" axis, wherein the "X" axis aligning member further comprises a feeder shoe configured to be placed over a feeder station of the pick and place machine, the feeder shoe configured having an inside face for indexing the feeder shoe against an inside face of a feeder station for aligning the parts pickup jig with the pick and place machine "X" axis;

a "Y" axis aligning member attached to the planar element for aligning the parts pick up jig with the pick and place machine "Y" axis; and a chip receiving and aligning member formed on the upper surface of the planar element for holding the chip for picking and aligning the chip with the pick and place machine "X" axis and the pick and place machine "Y" axis.

2. The parts pick up jig of claim 1 further comprising:

a first feeder shoe being attached at the first end of the planar element; and a second feeder shoe being attached at the second end of the planar element.

3. A parts pick up jig for use in the calibration of the accuracy of placement of components by a pick and place machine comprising:

a planar element having a first end, a second end and an upper surface;

an "X" axis aligning member attached to the planar element for aligning the parts pick up jig with the pick and place machine "X" axis, wherein the "X" axis aligning member further comprises a feeder shoe configured to be placed over a feeder station of the pick and place machine, the feeder shoe configured having an outer face for indexing the feeder shoe against an inside face of a feeder station for aligning the parts pickup jig with the pick and place machine "X" axis;

a "Y" axis aligning member attached to the planar element for aligning the parts pick up jig with the pick and place machine "Y" axis; and a chip receiving and aligning member formed on the upper surface of the planar element for holding the chip for picking and aligning the chip with the pick and place machine "X" axis and the pick and place machine "Y" axis.

4. The parts pick up jig of claim 3 further comprising:

a first feeder shoe being attached at the first end of the planar element; and a second feeder shoe being attached at the second end of the planar element.

5. A parts pick up jig for use in the calibration of the accuracy of placement of components by a pick and place machine comprising:

a planar element having a first end, a second end and an upper surface;

an "X" axis aligning member attached to the planar element for aligning the parts pick up jig with the pick and place machine "X" axis;

a "Y" axis aligning member attached to the planar element for aligning the parts pick up jig with the pick and place machine "Y" axis, wherein the "Y" axis aligning member further comprises a feeder shoe configured to be placed over a feeder station of the pick and place machine, the feeder shoe configured having a nose panel for indexing the feeder shoe against a nose of a feeder station for aligning the parts pickup jig with the pick and place machine "Y" axis; and a chip receiving and aligning member formed on the upper surface of the planar element for holding the chip for picking and aligning the chip with the pick and place machine "X" axis and the pick and place machine "Y" axis.

6. The parts pick up jig of claim 5 further comprising:

a first feeder shoe being attached at the first end of the planar element; and a second feeder shoe being attached at the second end of the planar element.

7. A parts pick up jig for use in the calibration of the accuracy of placement of components by a pick and place machine comprising:

a planar element having a first end, a second end and an upper surface;

an "X" axis aligning member attached to the planar element for aligning the parts pick up jig with the pick and place machine "X" axis;

a "Y" axis aligning member attached to the planar element for aligning the parts pick up jig with the pick and place machine "Y" axis; and a chip receiving and aligning member formed on the upper surface of the planar element for holding the chip for picking and aligning the chip with the pick and place machine "X" axis and the pick and place machine "Y" axis, the chip receiving and aligning member including a bridge section attached to and extending between a first feeder shoe and a second feeder shoe and a chip recess formed on an upper surface of the bridge section for receiving a chip and for aligning the chip with an "X" axis and a "Y" axis of the pick and place machine.

* * * * *